(12) United States Patent
Matsumoto et al.

(10) Patent No.: US 11,394,005 B2
(45) Date of Patent: Jul. 19, 2022

(54) METHOD OF MANUFACTURING ORGANIC EL DISPLAY DEVICE

(71) Applicant: Japan Display Inc., Tokyo (JP)

(72) Inventors: Yukio Matsumoto, Minato-ku (JP); Hiraaki Kokame, Minato-ku (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/128,812

(22) Filed: Dec. 21, 2020

(65) Prior Publication Data

US 2021/0111369 A1 Apr. 15, 2021

Related U.S. Application Data

(62) Division of application No. 15/475,688, filed on Mar. 31, 2017, now Pat. No. 10,910,591.

(30) Foreign Application Priority Data

Jun. 17, 2016 (JP) ................................. 2016-120448

(51) Int. Cl.
*H01L 51/52* (2006.01)
*H01L 51/56* (2006.01)

(52) U.S. Cl.
CPC ...... *H01L 51/5246* (2013.01); *H01L 51/5203* (2013.01); *H01L 51/5237* (2013.01); *H01L 51/56* (2013.01)

(58) Field of Classification Search
CPC ............ H01L 51/5246; H01L 51/5203; H01L 51/5237; H01L 51/56
See application file for complete search history.

(56) References Cited

U.S. PATENT DOCUMENTS

| 6,781,162 | B2 | 8/2004 | Yamazaki |
| 7,173,373 | B2 | 2/2007 | Yamada |
| 7,839,083 | B2 | 11/2010 | Kubota |
| 8,269,227 | B2 | 9/2012 | Yamazaki |
| 2002/0011783 | A1 | 1/2002 | Hosokawa |

(Continued)

FOREIGN PATENT DOCUMENTS

| JP | 2015-170493 A | 9/2015 |
| JP | 2015-176717 | 10/2015 |
| WO | 2003/061346 | 7/2003 |

OTHER PUBLICATIONS

Office Action dated Aug. 27, 2019 in corresponding Japanese Patent Application No. 2016-120448, along with a computer-generated English translation.

*Primary Examiner* — Eugene Lee
(74) *Attorney, Agent, or Firm* — Oblon, McClelland, Maier & Neustadt, L.L.P.

(57) ABSTRACT

An organic EL display device according to an embodiment of the present invention includes a substrate on which a display region including a plurality of pixels including an organic EL layer and an external region that surrounds the display region are formed, at least one separating wall that is formed at a part of the external region on the substrate, and an organic layer that covers at least a part of the display region, includes an organic material, and is formed on a display region side of the at least one separating wall. A wall surface of the display region side of the at least one separating wall includes an inclined surface that is inclined toward the display region side as it is extended away from the substrate.

4 Claims, 6 Drawing Sheets

(56) References Cited

U.S. PATENT DOCUMENTS

| | | |
|---|---|---|
| 2008/0088784 A1 | 4/2008 | Nakayama |
| 2008/0284323 A1 | 11/2008 | Kashiwabara |
| 2009/0278450 A1 | 11/2009 | Sonoyama |
| 2010/0066240 A1 | 3/2010 | Park |
| 2011/0018007 A1* | 1/2011 | Kasahara ............ H01L 27/3246 257/88 |
| 2012/0175603 A1* | 7/2012 | Takeuchi ............ H01L 27/3258 257/40 |
| 2012/0217518 A1* | 8/2012 | Abe .................... H01L 51/5209 257/88 |
| 2012/0228603 A1 | 9/2012 | Nakamura |
| 2013/0328039 A1* | 12/2013 | Ohuchi ............... H01L 51/5228 257/40 |
| 2014/0284591 A1 | 9/2014 | Ono |
| 2014/0346484 A1* | 11/2014 | Nendai .................. H01L 51/56 257/40 |
| 2014/0367655 A1 | 12/2014 | Takii |
| 2015/0155516 A1* | 6/2015 | Yamashita .............. H01L 51/56 257/40 |
| 2015/0207098 A1 | 7/2015 | Yasuda |
| 2017/0117487 A1 | 4/2017 | Kawakami |
| 2017/0170254 A1* | 6/2017 | Ishii ...................... H01L 27/322 |
| 2020/0257402 A1* | 8/2020 | Miyake ............... G06F 3/04164 |

* cited by examiner

METHOD OF MANUFACTURING ORGANIC EL DISPLAY DEVICE

CROSS-REFERENCE TO RELATED APPLICATION

The present application is a divisional Application of U.S. application Ser. No. 15/475,688, filed Mar. 31, 2017, which claims priority from the Japanese Application JP2016-120448, filed on Jun. 17, 2016, the contents of which are incorporated herein by reference.

BACKGROUND OF THE INVENTION

1. Field of the Invention

One or more embodiments of the present invention relate to an organic EL display device and a method of manufacturing an organic EL display device.

2. Description of the Related Art

For example, as disclosed in Japanese Patent Application Laid-open No. 2015-176717, a method is adopted where on an organic EL display device a display region that includes a plurality of pixels including an organic EL layer is sealed, in order to protect the organic EL layer from moisture and the like.

SUMMARY OF THE INVENTION

As the above sealing method, for example, a method to combine an inorganic material film and an organic material layer is used. However, there is a problem that moisture easily intrude into the organic EL layer from an end part of the sealing region.

One or more embodiments of the present invention realize, with regard to the above, an organic EL display device that is capable of certainly preventing an intrusion of moisture into the organic EL layer, and a manufacturing method thereof.

According to one aspect of the present invention, an organic EL display device is provided. The organic EL display device includes a substrate on which a display region including a plurality of pixels including an organic EL layer and an external region that surrounds the display region are formed, at least one separating wall that is formed at a part of the external region on the substrate, and an organic layer that covers at least a part of the display region, includes an organic material, and is formed on a display region side of the at least one separating wall. A wall surface of the display region side of the at least one separating wall includes an inclined surface that is inclined toward the display region side as it is extended away from the substrate.

In one embodiment of the present invention, the pixels include a first electrode formed on a side of the organic EL layer opposite from the substrate, and the organic layer is formed on the substrate on a side of a first inorganic film opposite from the substrate, the first inorganic film being formed on a side of the first electrode opposite from the substrate and composed of an inorganic material.

In one embodiment of the present invention, a second inorganic film that integrally covers the organic layer and the at least one separating wall and is composed of an inorganic material is formed.

In one embodiment of the present invention, the at least one separating wall surrounds a whole periphery of the display region.

In one embodiment of the present invention, the at least one separating wall includes a plurality of separating walls, and the separating walls surround the whole periphery of the display region.

According to another aspect of the present invention, a method of manufacturing an organic EL display device is provided. The method includes forming a separating wall in an external region of a substrate on which a display region and the external region are formed, wherein the display region includes a plurality of pixels including an organic EL layer and the external region surrounds the display region, dripping a formation material of an organic layer including an organic material on a display region side of the separating wall, and forming, on a wall surface of the display region side of the separating wall, an inclined surface that is inclined toward the display region side as the inclined surface is extended away from the substrate.

In one embodiment of the present invention, the method further includes forming a first inorganic film composed of an inorganic material on the substrate before dripping the formation material of the organic layer.

In one embodiment of the present invention, the method further includes forming a second inorganic film composed of an inorganic material that integrally covers the organic layer and the separating wall after dripping the formation material of the organic layer to form the organic layer.

In one embodiment of the present invention, the method further includes forming a separating wall formation film with a photosensitive resin composition on the substrate, disposing, on the separating wall formation film, a photomask including a light transmitting part that corresponds to a part where the separating wall is formed, disposing a light source above the display region, and forming the separating wall by an exposure to perform a development.

DETAILED DESCRIPTION OF THE INVENTION

Below, respective embodiments of the present invention are explained with reference to the accompanying drawings.

The disclosed embodiments are merely examples, and appropriate variations within the spirit of the present invention that can be easily arrived at by those skilled in the art are naturally included in the scope of the present invention. Further, while the width, thickness, shape, and the like of each part in the drawings may be illustrated schematically as compared with the actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

Figure 1:
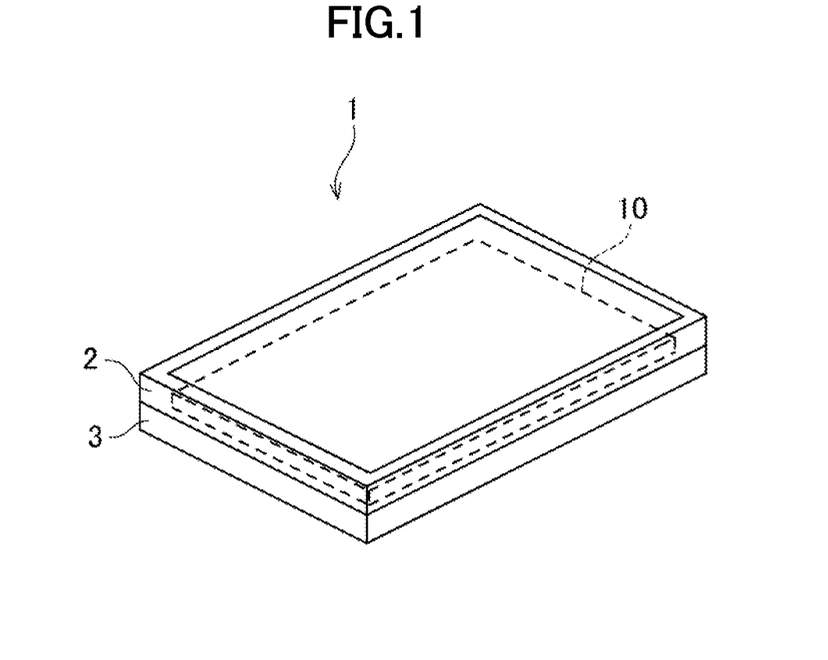
FIG. 1 is a view schematically illustrating an organic EL display device of one embodiment of the present invention.

FIG. 1 is a schematic view of an organic EL display device 1 of one embodiment of the present invention. The organic EL display device 1 is composed of an upper frame 2, a lower frame 3 and an organic EL panel 10 that is fixed so as to be sandwiched by the upper frame 2 and the lower frame 3. The embodiment should not limited to the illustrated example, and for example, the organic EL display device 1 may be composed only of the organic EL panel 10, without including the upper frame 2 and the lower frame 3.

Figure 2:
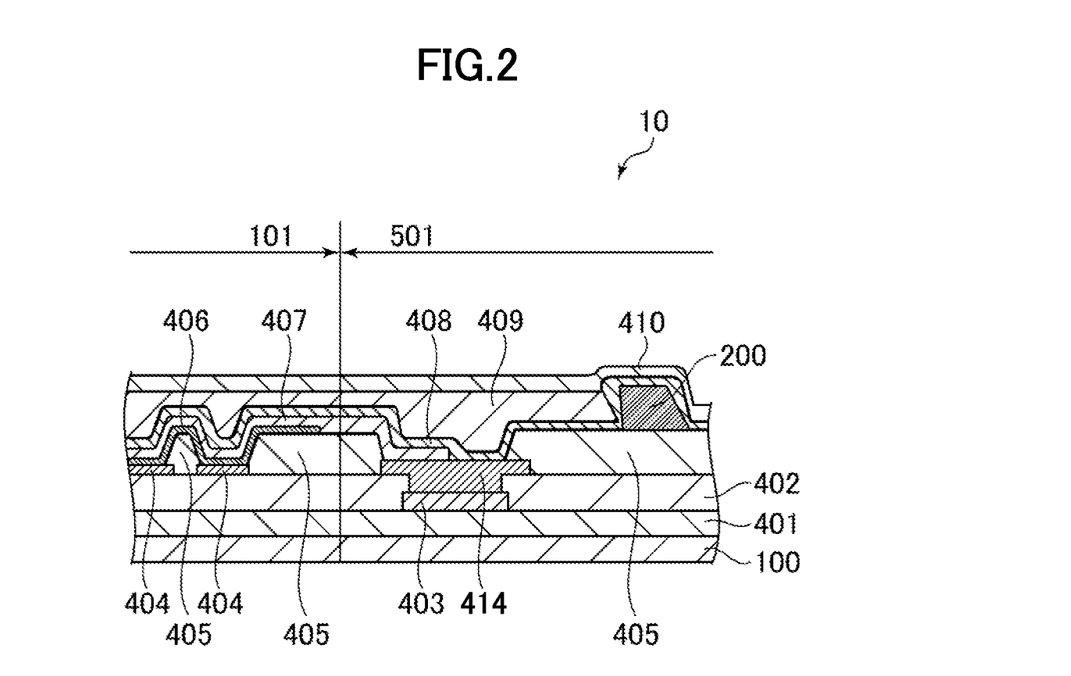
FIG. 2 is a view illustrating a part of a cross section of an organic EL panel.
Figure 5A:
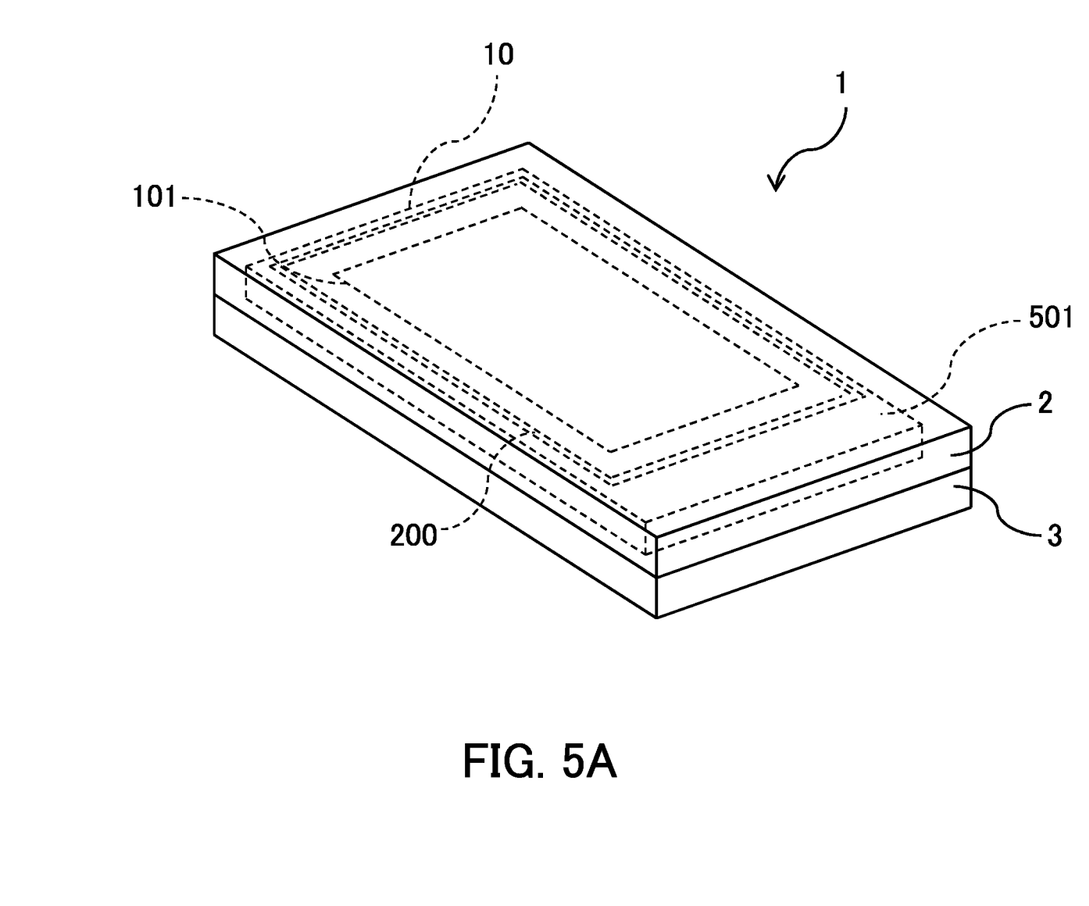
FIG. 5A is a view schematically illustrating an organic EL display device of one embodiment of the present invention.
Figure 5B:
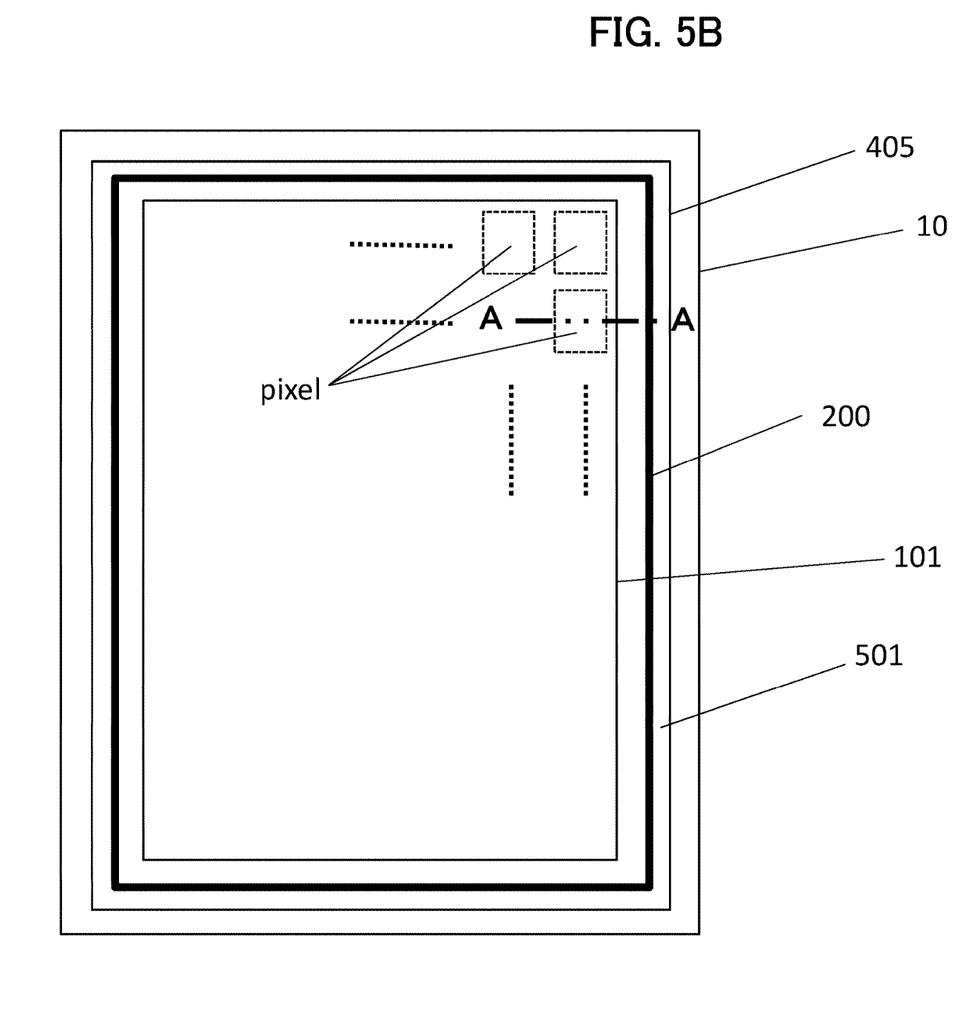
FIG. 5B is a view schematically illustrating an organic EL display device of one embodiment of the present invention.

FIG. 2 is a view illustrating a part of a cross section of the organic EL panel 10 taken along the line A-A in FIG. 5B. As illustrated in FIG. 2, on a substrate 100, a TFT layer 401 where TFT and the like (such as a switching transistor and a driver transistor) for driving pixels are formed is provided, and on the TFT layer 401 an interlayer insulating film 402 is formed. A display region 101 is formed on the substrate 100. Further, on the substrate 100, an external region 501 is formed so as to surround the display region 101 outside the display region 101. See FIGS. 5A and 5B. A wiring layer 403 that is connected to a cathode electrode 407 to be described later is formed at a part of the external region 501.

At a predetermined region on the interlayer insulating film 402 and the wiring layer 403, an anode electrode 404 is formed. The anode electrode 404 is formed of, for example, a transparent conductive material such as ITO (Indium Tin Oxide) or IZO (Indium Zinc Oxide).

A rib layer 405 that separates the pixels is formed on the above structure, and an organic EL layer 406 is formed on the anode electrode 404 and the rib layer 405. Here, a region where the anode electrode 404 contacts the organic EL layer 406 becomes a light emitting region, and the rib layer 405 defines an outer edge of the light emitting region.

The cathode electrode 407 is formed on the organic EL layer 406. The cathode electrode 407 is formed of, for example, a transparent conductive material such as IZO or an ultrathin alloy of Mg and Ag. Note that the organic EL layer 406 is formed, for example, by laminating a hole transporting layer, a light emitting layer, an electron transporting layer in this order from an anode electrode 404 side, but since it is widely known, a detailed explanation thereof is omitted.

A separating wall 200 is formed at a part of the external region 501 so as to surround the display region 101. In the illustrated example, the separating wall 200 is formed on the rib layer 405. The separating wall 200 has an inclined surface which is inclined downwardly as its inner side surface (wall surface) is extended outwardly. When seen from the substrate side, the inner side surface has the inclined surface that is inclined inwardly as it is extended away from the substrate 100.

A first sealing film 408 is formed that is composed of an inorganic material on the cathode electrode 407, and a second sealing film 410 is formed that is composed of an inorganic material over the first sealing material 408 with an interposition of an organic layer (a planarizing layer) 409 including an organic material. The first sealing film 408 is formed so as to also cover the separating wall 200 continuously from the display region 101. The organic layer (the planarizing layer) 409 is formed inside the separating wall 200. The second sealing film 410 is formed so as to also cover the separating wall 200 continuously from the display region 101. Note that the organic layer (the planarizing layer) 409 may include a region that is not continuously formed (not shown) in the display region 101 and/or the external region 501.

Below, an organic EL display device of one embodiment of the present invention and a manufacturing method thereof are explained with reference to FIGS. 3A to 3E. Here, a manufacturing method of a general organic EL display device itself is not explained since it is widely known. Below, a method of forming a sealing structure and an organic layer of the organic EL display device of this embodiment is primarily explained.

Figure 3A:
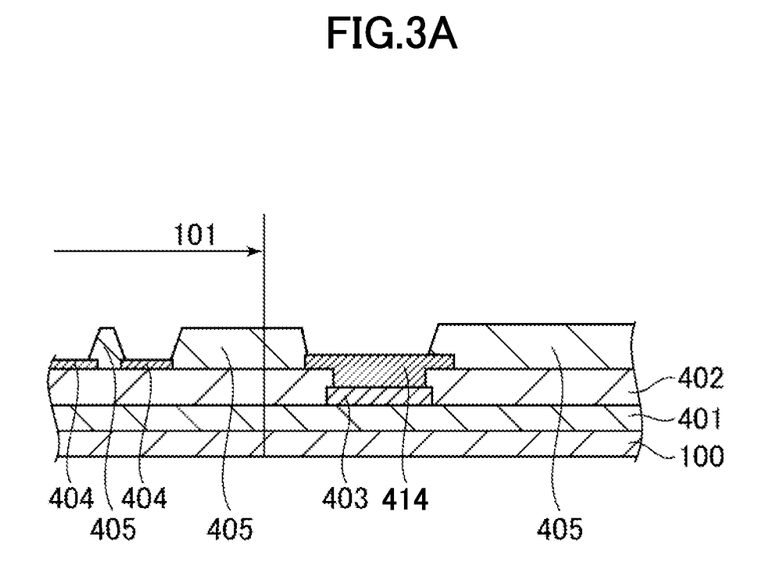
FIG. 3A is a view illustrating a method of manufacturing an organic EL display device of one embodiment of the present invention.

As illustrated in FIG. 3A, the anode electrode 404 and the rib layer 405 are formed in this order over the TFT layer 401 formed on the substrate 100 with an interposition of the interlayer insulating film 402. Outside the display region 101, a conductive layer 414 in the same layer as the anode electrode 404 is formed on the wiring layer 403.

Figure 3B:
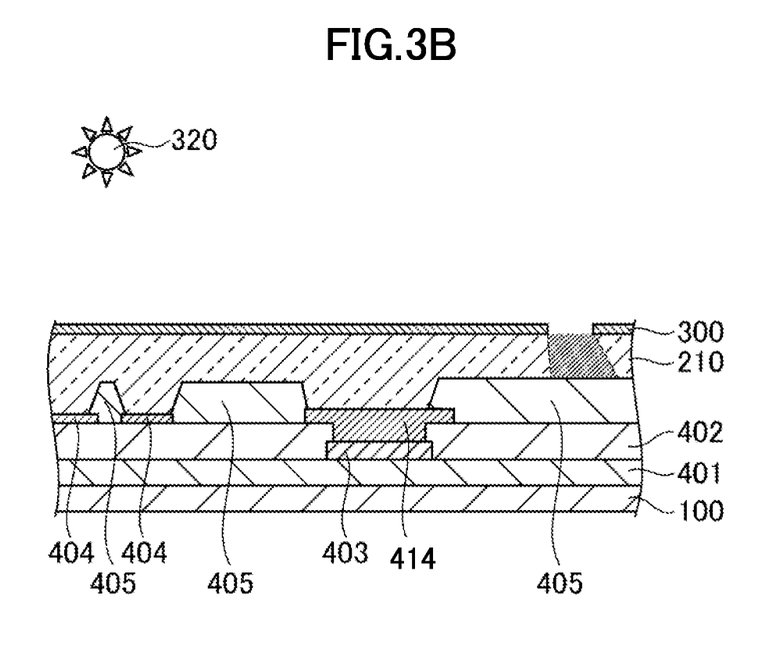
FIG. 3B is a view illustrating a method of manufacturing an organic EL display device of the one embodiment of the present invention.
Figure 4:
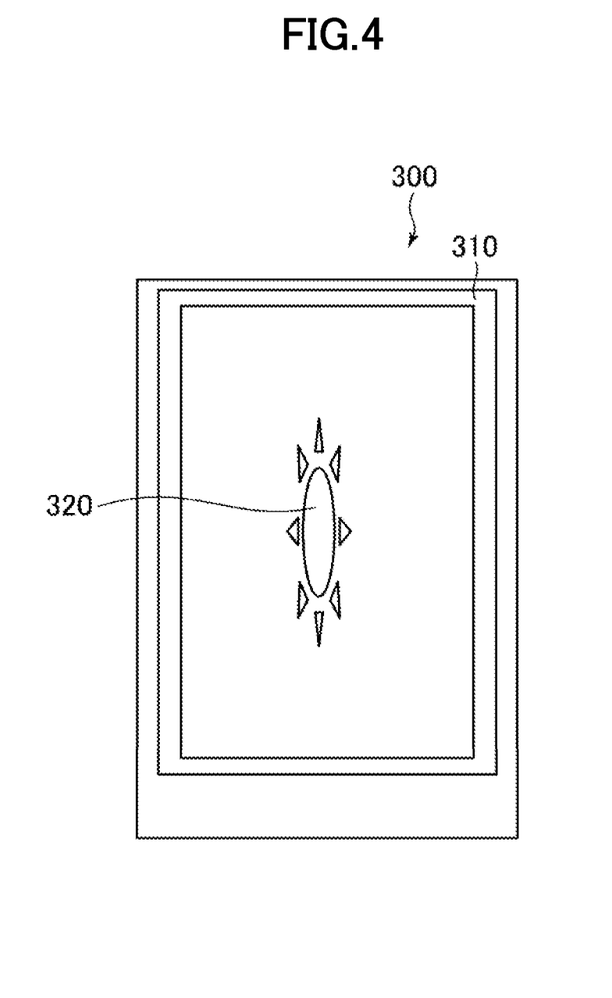
FIG. 4 is a top view of a photomask illustrated in FIG. 3B.

Next, as illustrated in FIG. 3B, a separating wall formation film 210 is formed with a photosensitive resin composition (e.g., a negative type photoresist) over the substrate 100, and subsequently, a photomask 300 having a predetermined mask pattern is disposed on the separating wall formation film 210. FIG. 4 illustrates a top view of the photomask 300. A light transmitting part 310 corresponding to a part where the separating wall is formed is formed on the photomask 300. In the illustrated example, the light transmitting part 310 has a predetermined width, and is formed in a shape of line surrounding the display region. Note that the photomask 300 can be obtained, for example, by forming a predetermined pattern of a light shielding part on a base material that is light transmitting such as a quartz board.

Figure 3C:
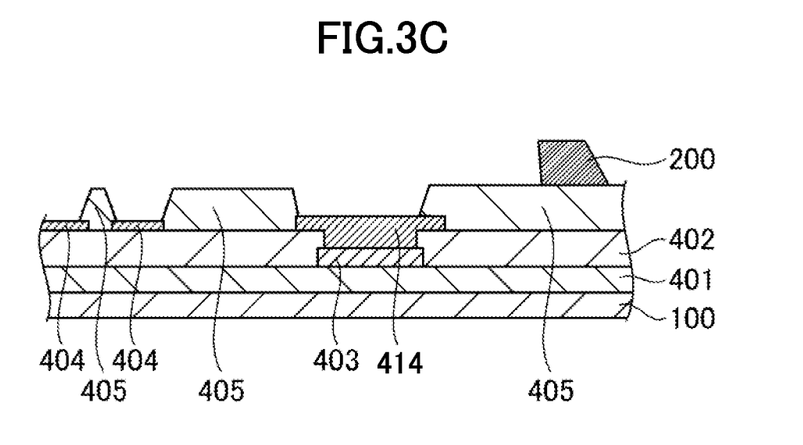
FIG. 3C is a view illustrating a method of manufacturing an organic EL display device of the one embodiment of the present invention.

Subsequently, the separating wall formation film 210 is exposed with the photomask 300 disposed thereover, a development is performed by an arbitrary appropriate method, and as illustrated in FIG. 3C, the separating wall 200 is formed that includes an inclined surface that is inclined downwardly as the inner side surface is extended outwardly. Specifically, as illustrated in FIG. 4, by providing a light source 320 above a central part of the display region and having it emit light toward the outside of the display region, the separating wall 200 including the inclined surface that is inclined downwardly as the side surface is extended outwardly can be formed. By adjusting exposure conditions such a setting position of the light source 320, the separating wall 200 having a desired shape (e.g., an extent of the inclination of the side surface) can be formed. Note that in the illustrated example, one separating wall 200 is provided, but more than one separating walls 200 may be provided as well. See FIG. 5A. Further, in the illustrated example, the separating wall 200 is formed on the rib layer 405, but a separating wall as described above may be formed, for example, by forming a concave portion or a convex portion on the rib layer 405 (not illustrated).

Figure 3D:
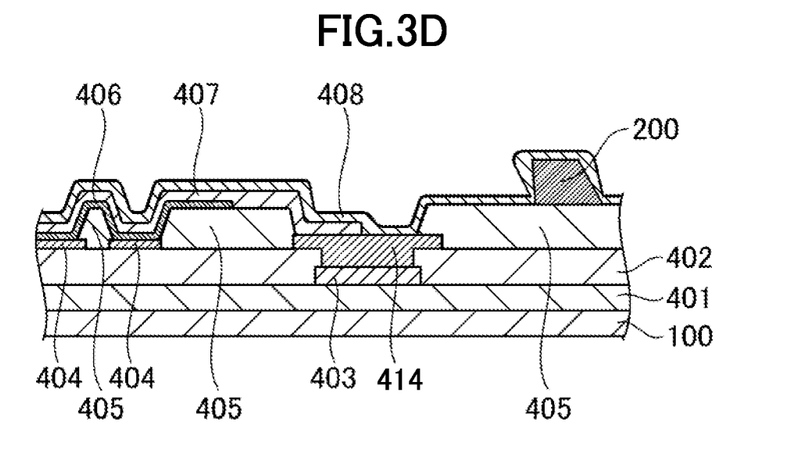
FIG. 3D is a view illustrating a method of manufacturing an organic EL display device of the one embodiment of the present invention.

Next, as illustrated in FIG. 3D, the organic EL layer 406 and the cathode electrode 407 are formed in this order, and subsequently, the first sealing film 408 (e.g., an inorganic film such as SiN) is formed. The first sealing film 408 is formed so as to cover the separating wall 200 as well continuously from the display region, in order to prevent an intrusion of moisture into the organic EL layer 406.

Figure 3E:
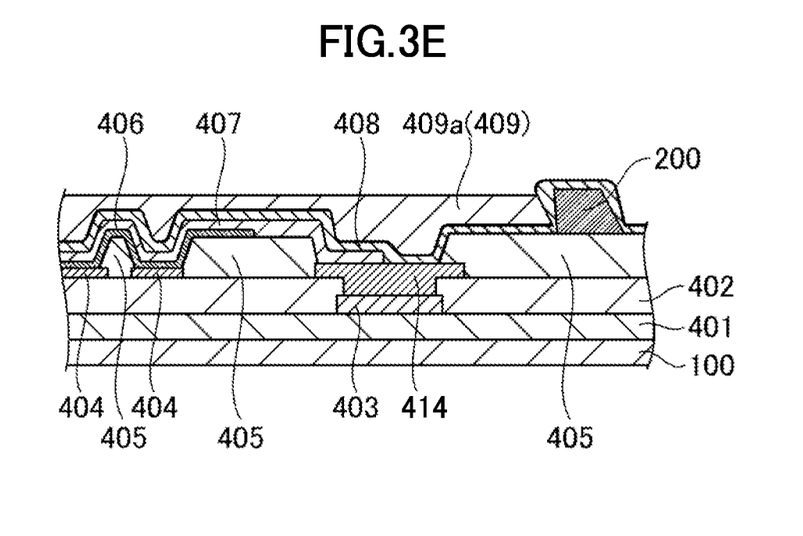
FIG. 3E is a view illustrating a method of manufacturing an organic EL display device of the one embodiment of the present invention.

Next, as illustrated in FIG. 3E, a coating film 409a is formed by dripping a formation material of the organic layer in an arbitrary appropriate manner so that the organic layer (the planarizing layer) with a predetermined thickness (e.g., around 10 μm) can be obtained inside the separating wall 200. Since the separating wall 200 is formed that includes the inclined surface that is inclined downwardly as the inner side surface is extended outwardly, it can be effectively prevented that the dripped formation material of the organic layer (the coating film 409a) flows out of the separating wall 200. Specifically, even in the case where the dripping amount is excessive, the coating film spreads firstly along the separating wall 200. Therefore, unless a huge amount of the formation material of the organic layer is dripped, it does not flows out of the separating wall 200.

The formation material of the organic layer typically includes a curable resin composition. The viscosity of the formation material of the organic layer when it is dripped is, for example, set to be low, from the viewpoint of the formation of a uniform organic layer (the coating film). For example, it is preferable to set the viscosity as 1 cps to 100 cps when measured under a condition of 25° C. and 100 rpm with an E-type viscometer. Further, it is more preferable to set it as 5 cps to 25 cps, and it is particularly preferable to set it as around 10 cps. Further, a contact angle of the formation material of the organic layer with respect a dripping surface (the first sealing film 408) is, for example, set to be low, from the viewpoint of the formation of a uniform organic layer (the coating film). For example, it is set to be 10° or less. Since the separating wall 200 as described above is formed, the viscosity and the contact angle can be set to be those values. Note that the organic layer 409 is formed after the dripping for example by curing the coating film 409a. As the curing method of the coating layer, an arbitrary appropriate method is adopted according to the curable resin composition to be used. For example, it is possible to use both of light (UV) curing and heat curing, and it is also possible to use only one of light (UV) curing and heat curing.

Next, as illustrated in FIG. 2, the second sealing film 410 (e.g., an inorganic film such as SiN) if formed on the organic layer 409. The second sealing film 410 is formed so as to cover the separating wall 200 as well continuously from the display region 101 in order to prevent an intrusion of moisture into the organic EL layer 406. As described above, since the organic layer 409 is contained inside the separating wall 200, the surface of the organic layer 409 is favorably covered by the second sealing film 410 (i.e., there is no part where the organic layer 409 is uncovered), and the intrusion of moisture into the organic EL layer 406 can be effectively prevented.

Although it is not illustrated, it is of course necessary to have a process where the substrate is divided into individual pieces of panels (individual chips) at an arbitrary appropriate point of time.

The present invention is not limited to the above embodiments, and various variations are possible. For example, the configurations shown in the above embodiments can be replaced with a configuration that is substantially the same with them, a configuration that exhibits the same working effect, or a configuration that can achieve the same goal.

Those skilled in the art should be able to arrive at various kinds of variations and modifications within the spirit of the present invention, ant it is understood that such variations and modifications are within the scope of the present invention. For example, addition, deletion, or design change of components, or by addition, omission, or condition change of processes made by those skilled in the art as appropriate in each embodiment described above are also encompassed within the scope of the present invention as long as they fall within the spirit of the present invention.

What is claimed is:

1. A method of manufacturing an organic EL display device comprising:
   forming a separating wall as part of an external region on a substrate on which a display region and the external region are formed, wherein the display region comprises a plurality of pixels comprising an organic EL layer, and the external region surrounds the display region, wherein the pixels comprise a first electrode;
   dripping a formation material of an organic planarizing layer including an organic material on a side of the separating wall that faces the display region such that the substrate, the organic EL layer, and the organic planarizing layer are arranged in this order in the display region, and
   forming, on a wall surface of the side of the separating wall, an inclined surface that is inclined toward the display region as the inclined surface is extended away from the substrate such that the separating wall blocks the organic planarizing layer from spreading,
   wherein the substrate, the organic EL layer, the first electrode, a first inorganic film, and the organic planarizing layer are arranged in this order from the substrate to the organic planarizing layer.

2. The method of manufacturing an organic EL display device according to claim 1, further comprising forming the first inorganic film composed of an inorganic material on the substrate before dripping the formation material of the organic layer.

3. The method of manufacturing an organic EL display device according to claim 1, further comprising forming a second inorganic film composed of an inorganic material that integrally covers the organic layer and the separating wall after dripping the formation material of the organic layer to form the organic layer.

4. The method of manufacturing an organic EL display device according to claim 1, wherein the step of forming the separating wall further comprises:
   forming a separating wall formation film with a photo-sensitive resin composition on the substrate;
   disposing, on the separating wall formation film, a photomask including a light transmitting part that corresponds to a part where the separating wall is formed;
   exposing the separating wall formation film to perform a development by a light source that is arranged above the display region.

* * * * *